(12) United States Patent
Zhang et al.

(10) Patent No.: US 10,110,249 B2
(45) Date of Patent: Oct. 23, 2018

(54) COLUMN-LAYERED MESSAGE-PASSING LDPC DECODER

(71) Applicant: SANDISK TECHNOLOGIES LLC, Plano, TX (US)

(72) Inventors: Xinmiao Zhang, Mercer Island, WA (US); Alexander Bazarsky, Holon (IL); Ran Zamir, Ramat Gan (IL); Eran Sharon, Rishon Lezion (IL); Idan Alrod, Herzliya (IL); Omer Fainzilber, Herzliya (IL); Sanel Alterman, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 3 days.

(21) Appl. No.: 15/244,444

(22) Filed: Aug. 23, 2016

(65) Prior Publication Data

US 2018/0062666 A1    Mar. 1, 2018

(51) Int. Cl.
| | | |
|---|---|---|
| H03M 13/00 | (2006.01) | |
| H03M 13/11 | (2006.01) | |
| G06F 11/10 | (2006.01) | |
| G11C 29/52 | (2006.01) | |

(52) U.S. Cl.
CPC ..... *H03M 13/1111* (2013.01); *G06F 11/1068* (2013.01); *G11C 29/52* (2013.01); *H03M 13/114* (2013.01)

(58) Field of Classification Search
CPC ............. H03M 13/1111; H03M 13/114; G06F 11/1068; G11C 29/52
See application file for complete search history.

(56) References Cited

U.S. PATENT DOCUMENTS

| | | | | |
|---|---|---|---|---|
| 7,853,862 B2* | 12/2010 | Lakkis | ............... | H03M 13/1137 714/800 |
| 7,900,126 B2* | 3/2011 | Sun | ................... | H03M 13/1117 714/801 |
| 8,074,142 B2* | 12/2011 | Kamiya | ............. | H03M 13/1117 714/752 |
| 8,151,161 B2* | 4/2012 | Cho | ................... | H03M 13/1102 714/752 |
| 8,347,170 B2* | 1/2013 | Chung | ................. | H03M 13/114 714/752 |

(Continued)

OTHER PUBLICATIONS

Cai et al., "Finite Alphabet Iterative Decoders for LDPC codes: Optimization, Architecture and Analysis," IEEE Transactions on Circuits and Systems—I, vol. 61, No. 5, May 2014, pp. 1366-1375.

(Continued)

*Primary Examiner* — Esaw T Abraham
(74) *Attorney, Agent, or Firm* — Michael Best & Friedrich LLP

(57) ABSTRACT

In an illustrative example, a decoder includes a variable node unit (VNU) that includes a variable-to-check lookup table circuit configured to output a variable-to-check message corresponding to a check node. The VNU also includes a hard-decision lookup table circuit configured to output a hard decision value corresponding to a variable node. The decoder also includes a check node unit (CNU) responsive to the variable-to-check message and configured to generate an updated check-to-variable message.

19 Claims, 5 Drawing Sheets

(56) References Cited

U.S. PATENT DOCUMENTS

| | | | | |
|---|---|---|---|---|
| 8,433,970 | B2* | 4/2013 | Rault | H03M 13/1128 713/324 |
| 8,458,556 | B2* | 6/2013 | Planjery | H03M 13/1117 714/752 |
| 8,572,462 | B2* | 10/2013 | Kasai | H03M 13/1171 714/758 |
| 8,826,109 | B2* | 9/2014 | Zhang | H03M 13/1102 714/752 |
| 8,929,009 | B2* | 1/2015 | Yang | H03M 13/1111 360/39 |
| 9,258,015 | B2* | 2/2016 | Ish-Shalom | H03M 13/1111 |
| 2016/0006458 | A1 | 1/2016 | Li et al. | |

OTHER PUBLICATIONS

Chen et al., "Density Evolution for Two Improved BP-Based Decoding Algorithms of LDPC Codes," IEEE Communications Letters, vol. 6, No. 5, May 2002, pp. 208-210.

Cui et al., "Efficient Decoder Design for High-Throughput LDPC Decoding," Proc. IEEE Asia Pacific Conference on circuits and Systems, Macro, China, Nov. 2008, pp. 1640-1643.

Mansour et al., "A 640-Mb/s 2048-Bit Programmable LDPC Decoder Chip," IEEE Journal of Solid-State Circuits, vol. 41, No. 3, Mar. 2006, pp. 684-698.

Sassateli et al., "Two-Bit Message Passing Decoders for LDPC Codes Over the Binary Symmetric Channel," Proc. IEEE International Symposium and Information Theory, Korea, Jun. 2009, arXiv:0901.2090v3 [cs.IT] Mar. 7, 2009, pp. 1-35.

Sharon et al., "Convergence Analysis of Generalized Serial Message-Passing Schedules," IEEE Journal on Selected Areas in Communications Capacity Approaching Codes, vol. 27, No. 6, Aug. 2009, pp. 1013-1024.

Sharon, et al., "Efficient Serial Message-Passing Schedules for LDPC Decoding," IEEE Transactions on Information Theory, vol. 53, No. 11, Nov. 2007, pp. 4076-4091.

Zhang et al., "Shuffled Iterative Decoding," IEEE Transactions on Communications, vol. 53, No. 2, Feb. 2005, pp. 209-213.

* cited by examiner

COLUMN-LAYERED MESSAGE-PASSING LDPC DECODER

FIELD OF THE DISCLOSURE

The present disclosure is generally related to electronic devices and more particularly to decoding error correcting coding (ECC)-encoded data.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase a storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. Low-density parity-check (LDPC) ECC codes are adopted in numerous data storage and digital communication systems. These codes can be decoded using different algorithms and scheduling schemes that have various error-correcting performance and implementation costs.

In LDPC decoding, reliability messages are passed between check nodes and variable nodes iteratively until convergence is achieved and the decoded word is error-free. Compared to a traditional flooding scheduling scheme, layered schemes can achieve around twice the convergence speed by updating each message multiple times in a decoding iteration. Additionally, column-layered schemes are more suitable than row-layered schemes for high-speed applications because column-layered schemes process all check nodes simultaneously. However, complex hardware for generation of the updated messages for column-layered schemes increases design and manufacturing costs.

Conventional column-layered schemes are typically designed for a Min-sum decoding algorithm. Although such column-layered schemes tend to converge faster than flooding schemes and can achieve higher throughput than row-layered schemes, updating of messages uses at least three values for each row of the parity check matrix H, including a min1 (first minimum) value, a min2 (second minimum) value, and the index of the min1 value. Storing these values requires a relatively large amount of memory. Moreover, approximations that are used to update messages using only min1, min2, and the index of min1 for each row result in error-correcting performance losses, and additional values, such as a min3 (third minimum) value, are typically needed to mitigate such performance loss.

In order to achieve satisfactory error-correcting performance and not to have early error floor, the Min-sum algorithm usually requires 4-7 bits to represent each message. Using 4-7 bit messages requires use of relatively expensive components such as integer adders, comparators, and converters to implement the check and variable node processing steps of the decoding, resulting in increased manufacturing cost.

DETAILED DESCRIPTION

Particular aspects of the disclosure are described below with reference to the drawings. In the description, common or similar features may be designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. As an illustrative example, LDPC techniques may be utilized to improve reliability of wired or wireless communications. Those of skill in the art will recognize that techniques described herein are applicable to other implementations.

Figure 1:
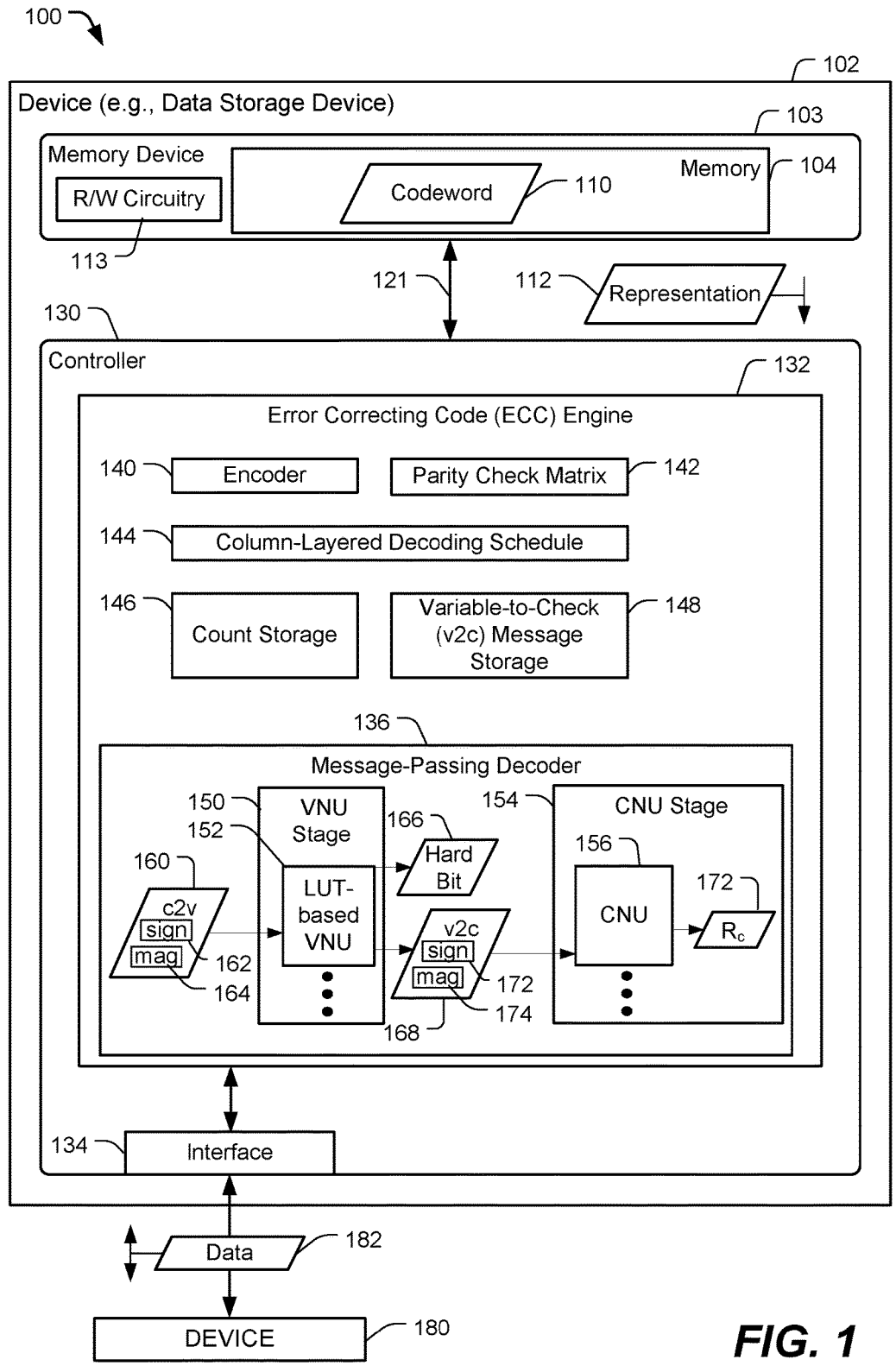
FIG. 1 is a diagram of a particular illustrative example of a system including a decoder that includes a lookup table-based VNU.

Referring to FIG. 1, a particular illustrative example of system is depicted and generally designated 100. The system 100 includes a device 102 (e.g., a data storage device) and a device 180 (e.g., an access device that accesses the device 102). The device 102 includes an error correction code (ECC) engine 132 with a decoder 136 that includes a lookup table (LUT)-based variable node unit (VNU) 152.

The data storage device 102 and the access device 180 may be operationally coupled via a connection (e.g., a communication path), such as a bus or a wireless connection. The data storage device 102 may include a first interface 134 (e.g., an access device interface) that enables communication via the communication path between the data storage device 102 and the access device 180, such as when the first interface 134 is communicatively coupled to the access device 180.

In some implementations, the data storage device 102 may be embedded within the access device 180, such as in accordance with a Joint Electron Devices Engineering Council (JEDEC) Solid State Technology Association Universal Flash Storage (UFS) configuration. For example, the data storage device 102 may be configured to be coupled to the access device 180 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 180 (i.e., "removably" coupled to the access device 180). As an example, the data storage device 102 may be removably coupled to the access device 180 in accordance with a removable universal serial bus (USB) configuration.

In some implementations, the data storage device 102 may include or correspond to a solid state drive (SSD) which may be included in, or distinct from (and accessible to), the access device 180. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 180 indirectly, e.g., via a network. For example, the network may include a data center storage system network, an enterprise storage system network, a storage area network, a cloud storage network, a local area network (LAN), a wide area network (WAN), the Internet and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 180 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The access device 180 may include a memory interface (not shown) and may be configured to communicate with the data storage device 102 via the memory interface to read data from and write data to the memory device 103 of the data storage device 102. For example, the access device 180 may operate in compliance with a Joint Electron Devices Engineering Council (JEDEC) industry specification, such as a Universal Flash Storage (UFS) Access Controller Interface specification. As other examples, the access device 180 may operate in compliance with one or more other specifications, such as a Secure Digital (SD) Access Controller specification, as an illustrative, non-limiting example. The access device 180 may communicate with the memory device 103 in accordance with any other suitable communication protocol.

The access device 180 may include a processor and a memory. The memory may be configured to store data and/or instructions that may be executable by the processor. The memory may be a single memory or may include multiple memories, such as one or more non-volatile memories, one or more volatile memories, or a combination thereof. The access device 180 may issue one or more commands to the data storage device 102, such as one or more requests to erase data, read data from, or write data to a memory device 103 of the data storage device 102. For example, the access device 180 may be configured to provide data, such as user data 182, to be stored at the memory device 103 or to request data to be read from the memory device 103. The access device 180 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The data storage device 102 includes a controller 130 and the memory device 103 that is coupled to the controller 130. The memory device 103 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks, such as a NAND flash erase group of storage elements. To illustrate, the memory 104 may include a group of storage elements that may be configured as a physical page, a word line, or a block, as illustrative, non-limiting examples. Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 113, to support operation of one or more memory dies of the memory device 103. Although depicted as a single component, the read/write circuitry 113 may be divided into separate components of the memory device 103, such as read circuitry and write circuitry. The read/write circuitry 113 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 130 is coupled to the memory device 103 via a bus 121, an interface (e.g., interface circuitry), another structure, or a combination thereof. For example, the bus 121 may include one or more channels to enable the controller 130 to communicate with a single memory die of the memory device. As another example, the bus 121 may include multiple distinct channels to enable the controller 130 to communicate with each memory die of the memory device 103 in parallel with, and independently of, communication with other memory dies of the memory device 103.

The controller 130 is configured to receive data and instructions from the access device 180 and to send data to the access device 180. For example, the controller 130 may send data to the access device 180 via the first interface 134, and the controller 130 may receive data from the access device 180 via the first interface 134. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The ECC engine 132 may be configured to receive data, such as the user data 182, and to generate one or more ECC codewords (e.g., including a data portion and a parity portion) based on the data. For example, the ECC engine 132 may receive the user data 182 and may generate a codeword 110. To illustrate, the ECC engine 132 may include an encoder 140 configured to encode the data using an ECC encoding technique. The ECC engine 132 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine 132 also includes the decoder 136, a parity check matrix 142, a column-layered decoding schedule 144, and memory or storage elements accessible to the decoder 136, illustrated as a count storage 146 and a variable-to-check (v2c) message storage 148. The parity check matrix (H) 142 is a sparse parity check matrix corresponding to an LDPC code. Each row of the parity check matrix 142 may correspond to a check node of an associated Tanner graph, and each column of the parity check matrix 142 may correspond to a variable node. A check node and a variable node are connected by an edge in the Tanner graph if the corresponding entry in the parity check matrix 142 is nonzero. The parity check matrix 142 may correspond to a quasi-cyclic LDPC (QC-LDPC) code where the parity check matrix 142 consists of M×N submatrices of dimension Z×Z, where M, N, and Z are positive integers and each submatrix is either zero or a cyclically shifted identity matrix.

The column-layered decoding schedule 144 may be used by the decoder 136 to decode data read from the memory 104, such as a representation 112 of the codeword 110. The column-layered decoding schedule 144 may indicate a schedule of iterative message passing between connected check nodes and variable nodes until a valid codeword is found or until a number of decoding iterations has reached a threshold number of decoding iterations. A vector r is a valid codeword if $rH^T=0$, where $H^T$ indicates the transpose of the parity check matrix H 142.

For example, the column-layered decoding schedule 144 may logically partition the parity check matrix 142 columnwise into layers. In examples described herein, a column layer may consist of a block of Z columns of the parity check matrix 142 (a "block column") to be processed in parallel. In other implementations, a column layer may consist of a portion of a block of Z columns (e.g., Z/2 columns) of the parity check matrix 142 to be processed in parallel. Messages generated from processing of a layer are used to update the messages for processing of the next layer right away. For example, multiple iterations of decoding may be performed. Each iteration may include processing of a first column layer of the parity check matrix 142, a second column layer of the parity check matrix 142, etc., until all column layers of the parity check matrix 142 have been processed during the iteration. Because messages may be updated during processing of one layer and used during processing of a next layer in a same iteration, messages may be updated multiple times during each iteration. The column-layered decoding schedule 144 may process all rows of the parity check matrix 142 concurrently (e.g., decode processing of a single column layer processes entries of all rows in the column layer), which may reduce a number of decoding clock cycles as compared to row-layered decoding.

The count storage 146 includes memory (e.g., an array of registers) configured to store counts of variable-to-check messages having a particular magnitude. For example, as described below, a count $R_c^{cnt}$ may be maintained and updated for each row of the parity check matrix 142. As described below, the counts $R_c^{cnt}$ may be used to reconstruct check-to-variable messages and may use reduced storage as compared to check node message information storage for a conventional Min-sum decoding scheme. For example, when each count $R_c^{cnt}$ is represented as a 3-bit value, the count storage 146 may be sized to store (3 bits per row)* (number of rows of the parity check matrix 142). Although the count storage 146 is described as an array of registers for high throughput during column-layered decoding, in other implementations the count storage 146 may include RAM or other storage accessible to the decoder 136.

The variable-to-check message storage 148 includes memory configured to store v2c messages. For example, each variable node may generate a v2c message for each check node connected to the variable node. As described below, each v2c message may be a 2-bit message and may use reduced storage as compared to larger v2c messages of a conventional Min-sum decoding scheme.

The decoder 136 may include a message-passing decoder that is configured to decode, according to the column-layered decoding schedule 144, data received at the controller 130 from the memory 104 to detect and correct bit errors that may be present in the data. For example, the decoder 136 may correct a number of bit errors up to an error correction capability of an LDPC code used by the encoder 140. In some implementations, the ECC engine 132 may be configured to determine and/or track a failed bit count (FBC), a bit error rate, or both, corresponding to data decoded by the decoder 136.

The decoder 136 is configured to reconstruct check-to-variable messages having a sign portion and a magnitude portion, such as a reconstructed c2v message 160 that includes a sign portion 162 and a magnitude portion 164. The sign portion 162 may be a single bit having a first value that indicates positive or having a second value that indicates negative. The magnitude portion 164 may be a single bit having a first value indicating a first magnitude or having a second value indicating a second magnitude. The c2v message 160 may be generated based on a count $R_c^{cnt}$ and v2c messages, such as described below with reference to Table 1. The c2v message 160 may be generated at a CNU, such as described with reference to FIG. 2.

The decoder 136 includes a variable node unit (VNU) stage 150 that includes one or more VNUs, such as the LUT-based VNU 152. The VNUs are responsive to check-to-variable (c2v) messages and are configured to generate variable-to-check messages (v2c). The LUT-based VNU 152 may include a variable-to-check lookup table circuit configured to output a variable-to-check message, such as a representative variable-to-check message (v2c) 168 corresponding to a check node. As used herein, a "lookup table circuit" may be implemented using memory that stores values to be retrieved based on received input values, or may be implemented using combinatorial logic circuitry that is configured to generate output values based on the input values, or a combination thereof. The v2c message 168 may include a sign portion 172 and a magnitude portion 174. The LUT-based VNU 152 may also include a hard-decision lookup table circuit configured to output a hard decision value, such as a representative hard bit (HB) 166, corresponding to a variable node. An example of generating v2c messages is provided in Table 1. Examples of VNU implementations that include a variable-to-check lookup table circuit and a hard-decision lookup table circuit are described with reference to FIGS. 3-4.

For example, in some implementations, the VNU 152 may include multiple v2c message LUT circuits and a hard decision LUT circuit, such as described in further detail with reference to FIG. 3. In some implementations, the VNU 152 may include a one-hot decoder circuit configured to generate one-hot outputs corresponding to the check-to-variable messages, such as described in further detail with reference to FIG. 4. The VNU 152 may also include a summer configured to output counts of the one-hot outputs, and the counts of the one-hot outputs may be routed to inputs of the variable-to-check lookup table circuit, as described with reference to FIG. 4.

The decoder 136 includes a check node unit (CNU) stage 154 that includes one or more CNUs, such as a CNU 156. The CNU 156 is responsive to the variable-to-check message 168 and configured to track, for each check node, a count $R_c$ 172. The count $R_c$ 172 corresponds to a count of v2c messages for a check node c that have a first value of the magnitude portion 174. Counts of v2c messages having the first value may be stored into and retrieved from the count storage 146. Such counts may be used to generate reconstructed c2v messages, such as the reconstructed c2v message 160, instead of using Min-sum values such as min1, min2, and index for each row. Each of the counts of v2c messages may be tracked as a saturating counter that uses a small number of bits (e.g., 3 bits), such as described with reference to Table 2. An example of using counts of v2c messages having the first value to reconstruct c2v messages is provided in Table 1. The CNU 156 may be implemented as a lookup table based CNU that includes a lookup table circuit configured to update $R_c$ 172 in accordance with Table 2 and to reconstruct the c2v message 160 based on $R_c$ 172 as indicated in Table 1.

The VNU stage 150 and the CNU stage 154 are configured to operate according to the column-layered decoding schedule 144. The VNU stage 150 may include a first number of VNUs corresponding to a column layer (e.g., a block column or portion of a block column) of the parity check matrix 142. The CNU stage 154 may include a second number of CNUs. The second number of CNUs may correspond to a multiple of a column weight of the parity check matrix 142. For example, the first number of VNUs may equal the submatrix size Z so that the VNU stage 150 includes a VNU for each variable node in a column layer for concurrent processing of all variable nodes in the column layer. The second number of CNUs may equal $Z*d_v$, where $d_v$ is the column weight (e.g., the largest number of 1's in any column) of the parity check matrix 142.

Each of the check-to-variable messages, such as the reconstructed c2v message 160 may be a two-bit message. Each of the variable-to-check messages, such as the v2c message 168, may also be a two-bit message.

During operation, the controller 130 is configured to receive user data 182 from the access device 180. The user data 182 may be received, via the first interface 134, along with a command from the access device 180 to write the user data 182 to the memory 104. The encoder 140 may encode the user data 182 using an LDPC scheme associated with the parity check matrix 142 to generate the codeword 110. The controller 130 may send the codeword 110 to be stored at the memory device 103.

The controller 130 may cause the memory device 103 to access a representation 112 of the codeword 110, such as in response to a request for read access from the device 180. The controller 130 may send a read command to cause the memory device 103 to sense the representation 112 of the codeword 110. The memory device 103 may provide the representation 112 to the controller 130. The representation 112 may match the codeword 110 or may differ from the codeword 110 due to one or more bit errors.

The controller 130 may iteratively process column-layered decoding of the representation 112 at the decoder 136, such as described further with reference to Table 1. For example, during sequential iterations, the decoder 136 may sequentially process column layers of the parity check matrix 142 and generate updated messages used in processing of the next layer. For each column layer, the decoder 136 may generate reconstructed c2v messages (e.g., c2v message 160) for each check node that is connected to a variable node in the column layer. The VNU stage 150 may generate, for each variable node in the column layer, a hard decision estimate (e.g., hard bit 166) and v2c message for each check node connected to the variable node (e.g., v2c message 168). The CNU stage 154 may update, for each check node that is connected to a variable node in the column layer, a count (e.g., $R_c$ 172) of the v2c messages that correspond to the check node and that have a first magnitude value. The updated counts may be stored to the count storage 146, and processing of the next column layer may proceed based on the updated count.

The decoder 136 may converge faster, such as by a factor of about 2, as compared to conventional flooding decoders. Faster convergence is at least partly because the check-to-variable messages are updated after processing each column layer and the most updated check-to-variable messages are used in the processing of the next column layer. The decoder 136 may also achieve several times higher throughput than row-layered decoders. For example, the decoder 136 may achieve 4 times higher throughput with 10% area overhead as compared to a conventional row-layered 3-bit Min-sum decoder for codes with a column weight of 4.

The decoder 136 may use a reduced amount of memory as compared to conventional Min-sum decoders because message updating uses a stored 3-bit count instead of stored values of min1 min2, and index (e.g., at least 3 bits for each of min1 and min2, and a number of bits for index is usually 5 or higher and is dependent on the row weight of the code). Additionally, because short messages (e.g., 2-bit messages) may be used, low-complexity CNU and VNU architectures may include LUT circuitry to further reduce complexity. As a result, the decoder 136 may use smaller area than a conventional column-layered Min-sum decoder.

Although FIG. 1 depicts use of LUT-based VNUs, storage of v2c message counts rather than conventional Min-sum c2v information (e.g., min1, min2, and index values), and use of 2-bit messages, in other implementations the decoder 136 may omit one or more of these features. For example, although use of LUT-based VNUs with low-resolution (e.g., 2-bit) messages enables the reduced complexity and cost as compared to conventional Min-sum VNU circuitry, in other implementations the decoder 136 may instead use one or more conventional Min-sum VNU circuits including adders and comparators to perform the variable node addition and comparison operations indicated in Table 1. As another example, although using CNUs configured to store counts of v2c messages having a first magnitude and to use the stored counts to reconstruct c2v messages reduces memory usage of the decoder 136 as compared to conventional Min-sum decoders, in other implementations the decoder 136 may instead use one or more conventional CNUs configured to store and retrieve Min-sum values (e.g., min1, min2, index) to reconstruct c2v messages.

Figure 2:
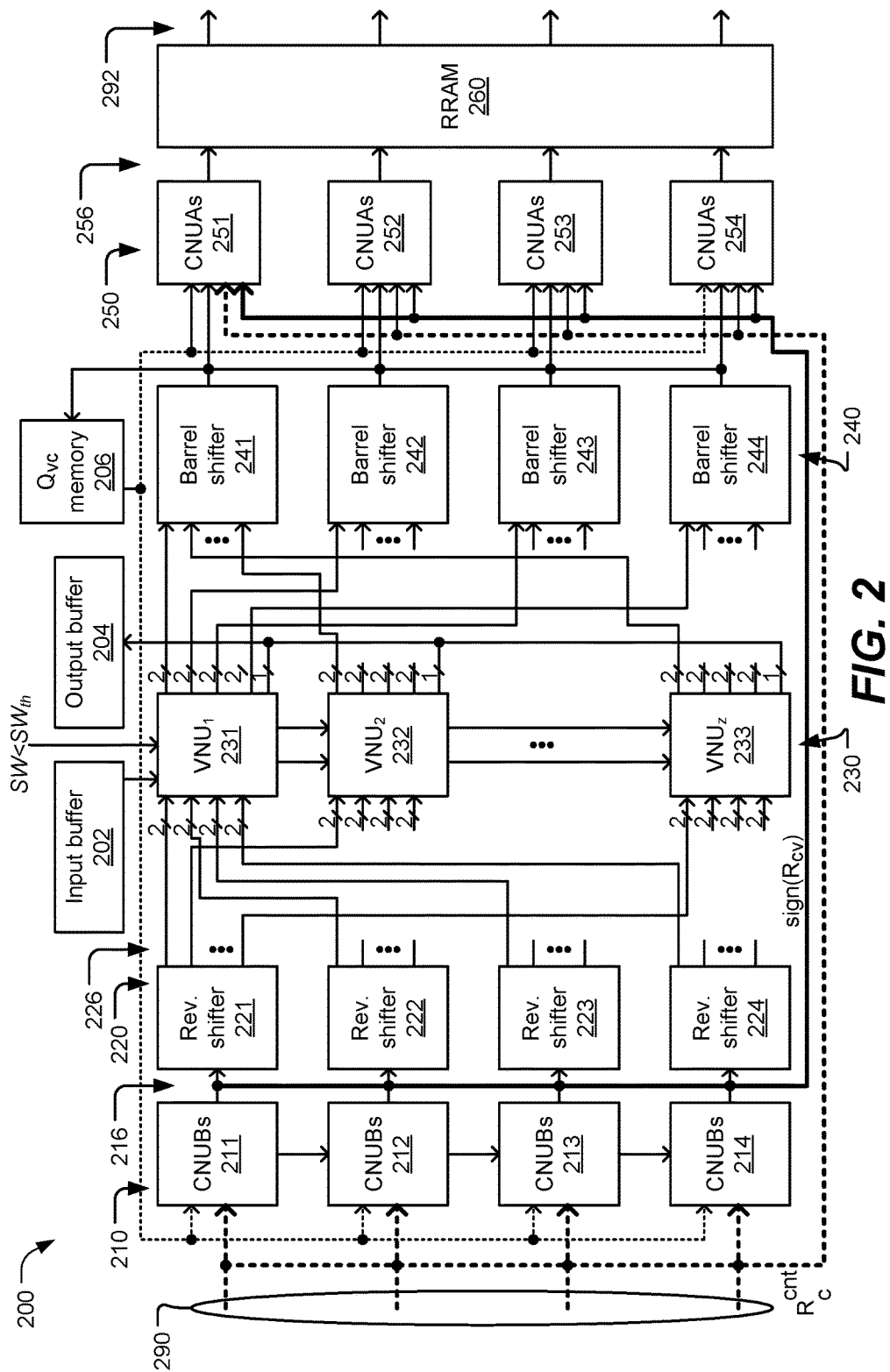
FIG. 2 is a diagram illustrating particular aspects of an example of the decoder of FIG. 1.
Figure 3:
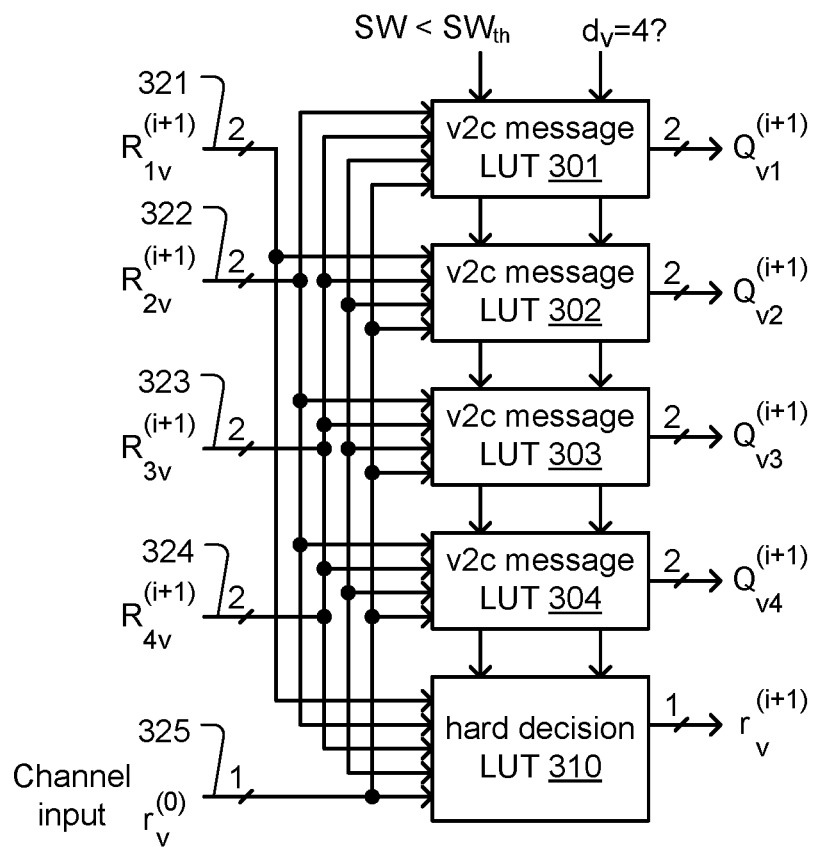
FIG. 3 is a diagram illustrating particular aspects of an example of the lookup table-based VNU of FIG. 1.
Figure 4:
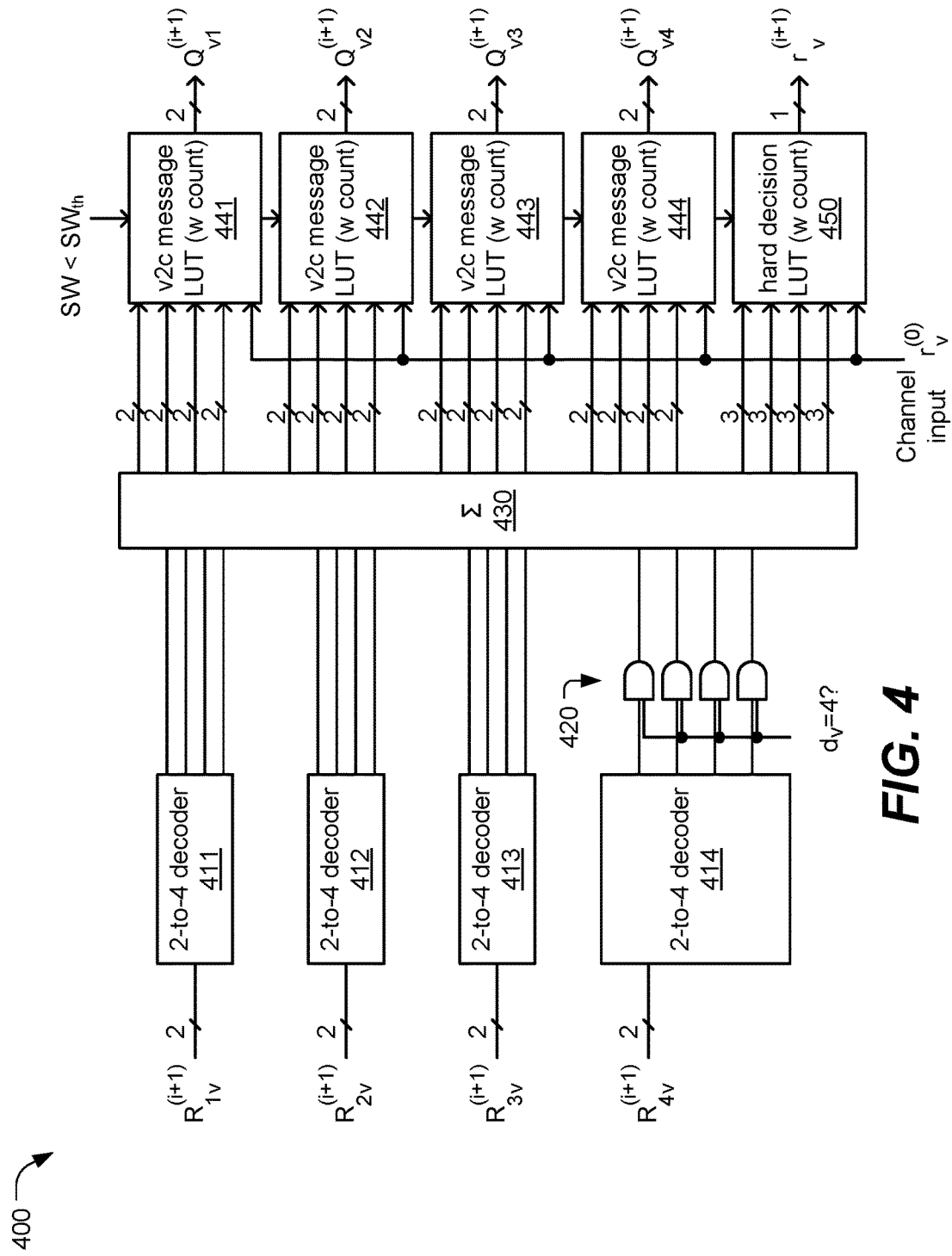
FIG. 4 is a diagram illustrating particular aspects of another example of the lookup table-based VNU of FIG. 1.

The decoder 136 of FIG. 1 may implement a low-complexity column-layered scheme using hardware architecture for a message-passing (e.g., 2-bit message passing) LDPC decoding algorithm, such as depicted in FIGS. 2-4. Compared to conventional Min-sum row-layered decoders, the decoder 136 may have better error-correcting capability and may be able to achieve several times higher throughput with relatively small silicon area overhead.

The decoder 136 may be configured, during processing of each block column of the H matrix, to update the check-to-variable (c2v) messages based on the variable-to-check (v2c) messages of the current block column, and the updated c2v messages are used when processing the next block column. As a result, the c2v messages associated with a row are updated multiple times in a decoding iteration. Hence, the overall convergence is increased by a factor of about 2 as compared to a flooding scheme in which the c2v messages are updated once in each iteration and in which the updated values are only used in the next decoding iteration.

A simplified low-complexity decoding method may be implemented for updating the c2v messages and generating the v2c messages for the next block column. Updating the c2v messages uses a single stored value for each row (e.g., $R_c$ 172) in conjunction with a decoding algorithm that uses a low message resolution (e.g., 2-bit messages) and can achieve higher correction capability than a multi-bit Min-sum algorithm. A simplified architecture configured to implement the decoding method may reduce implementation cost by utilizing aspects of the 2-bit decoding algorithm, as described further with reference to FIGS. 2-4.

An example of column-layered 2-bit message-passing (MP) LDPC decoding is presented in example computer code in Table 1. In Table 1, the magnitude of each $Q_{vc}$ (v2c) message has one of two values: "weak" (denoted "W" and representing a bit value such as "0") or "strong" (denoted "S" and representing a bit value such as "1"). In Table 1, W<S and the channel input (e.g., information representing the representation 112 of FIG. 1) has a fixed magnitude C. In Table 1, $R_c^{cnt}$ corresponds to the count 172 and is the count of all $Q_{vc}$ messages that are connected to a check node "c" and that have magnitude W. After every block column of the H matrix (e.g., the parity check matrix 142 of FIG. 1) is processed, $R_c^{cnt}$ for each check node connected to a variable node in the block column is updated according to the $Q_{vc}$ of the current block column. Next, the updated count is used to derive the $R_{cv}$ (c2v) messages and hence $Q_{vc}$ messages for the next block column. Since the most updated information is used in the processing of every block column, this column-layered scheme achieves around twice the convergence speed compared to a traditional flooding scheme.

TABLE 1

Input: C, S, W, r
Initialization: i = 0, l = 1, $r^{(0)}$ = r, $p_v$ = 1-2$r_v^{(0)}$
  $Q_{vc}^{(0)}$ = $p_v$ · W, $R_c^{cnt}$ = maxcnt, $s_c$ = $\Pi_{v \in N(c)} p_v$, SW = $\Sigma_{1 \le c \le n}(1 - s_c)/2$
While (i < $I_{max}$)
  check node processing (c2v message reconstruction part)
  {   for each column v in block l
      {   for each c ∈ N(v)
          {   if ((($|Q_{vc}^{(i)}|$ == W) & ($R_c^{cnt}$ == 1))|($R_c^{cnt}$ == 0))
                  if SW < $SW_{th}$
                      $|R_{cv}^{(i+1)}|$ = S
                  else
                      $|R_{cv}^{(i+1)}|$ = S − 1
              else
                  $|R_{cv}^{(i+1)}|$ = W
              sign($R_{cv}^{(i+1)}$) = $s_c$ · sign($Q_{vc}^{(i)}$)
          }
  hard decision computation $$t_v = \Sigma_{c \in N(v)} R_{cv}^{(i+1)} + p_v \cdot C; \ r_v^{(i+1)} = \begin{cases} 0 & \text{if } t_v > 0 \\ 1 & \text{if } t_v < 0 \\ r_v & \text{if } t_v = 0 \end{cases}$$

variable node processing
  for each c ∈ N(v)
  {
      $Q_{vc}'^{(i+1)} = \Sigma_{u \in N(v) \backslash c} R_{uv}^{(i+1)} + p_v \cdot C$ $$Q_{vc}^{(i+1)} = \begin{cases} W \cdot \text{sign}(Q_{vc}'^{(i+1)}) & \text{if } 0 < |Q_{vc}'^{(i+1)}| < S \\ S \cdot \text{sign}(Q_{vc}'^{(i+1)}) & \text{if } |Q_{vc}'^{(i+1)}| \ge S \\ W \cdot p_v & \text{if } |Q_{vc}'^{(i+1)}| = 0 \end{cases}$$

check node processing (count updating part)

TABLE 1-continued $$s_c = \text{sign}(R_{cv}^{(i+1)}) \cdot \text{sign}(Q_{vc}^{(i+1)})$$

$$R_c^{cnt} = \begin{cases} R_c^{cnt} - 1 & \text{if } (|Q_{vc}^{(i+1)}| == S) \,\&\, (|Q_{vc}^{(i)}| == W) \\ R_c^{cnt} + 1 & \text{if } (|Q_{vc}^{(i+1)}| == W) \,\&\, (|Q_{vc}^{(i)}| == S) \\ 1 & \text{if } (|Q_{vc}^{(i+1)}| == W) \,\&\, (R_c^{cnt} == 0) \end{cases}$$

saturate $R_c^{cnt}$

```
      }
    l = l + 1
  }
  i = i + 1
}
```

In Table 1, C represents the magnitude of the channel input, i represents an iteration index, $I_{max}$ represents an iteration number threshold, l represents a block column (column layer) index, r represents a received hard-decision bit vector, and $r_v^{(0)}$ represents the hard bit value of variable node v for iteration 0. Further, $p_v$ may represent a sign of the $v^{th}$ channel input, maxcnt represents a constant having a value that may be based on how many bits are used to represent $R_c^{cnt}$, SW represents syndrome weight, and $SW_{th}$ represents a threshold syndrome weight. When SW becomes 0, the decoding converges and can be stopped.

In Table 1, the message from variable node v to check node c is denoted by $Q_{vc}$, the message from check node c to variable node v is denoted by $R_{cv}$, N(v) is the set of check nodes connected to variable node v, and N(c) is the set of variable nodes connected to check node c. A check node c being in N(v) is expressed as c∈N(v), and u∈N(v)\c represents a check node u in N(v) other than check node c. In Table 1, "=" indicates an equality operator (i.e., A=B evaluates to a value of "True" when A equals B and "False" when A does not equal B), "&" indicates a logical AND operator, "|" indicates a logical OR operator, sign(A) indicates a sign (e.g., positive or negative) of A, and |A| indicates an absolute value or magnitude of A.

Compared to conventional column-layered decoding schemes, the decoding algorithm represented by the code in Table 1 uses substantially less memory and has simpler message updating and computation. The only check node value that may be recorded is $R_c^{cnt}$, and 3 bits may be used to represent $R_c^{cnt}$ for each row of the H matrix without any noticeable error-correcting performance loss. For example, because the v2c messages may be 2-bit messages with magnitude of S or W, if $R_c^{cnt}=0$ then (in terms of conventional Min-sum values) min1=min2=S. If $R_c^{cnt}=1$ then min1=W and min2=S. Otherwise, min1=min2=W. Hence, only $R_c^{cnt}$ may be recorded instead of recording min1, min2, and the index of min1. Compared to a 4-bit column-layered Min-sum decoder that stores the min1 (e.g., 3 bits), min2 (e.g., 3 bits), and the index of min1 (e.g., 5 bits) for each row in a typical 4-bit column-layered Min-sum decoder (e.g., 3+3+5=11 bits per row), the 3-bit value of $R_c^{cnt}$ enables reduced memory usage during decoding.

Also in Table 1, the c2v message magnitude $|R_{cv}^{(i+1)}|$ is adjusted (lowered) from S to S−1 when the syndrome weight SW is larger than a threshold $SW_{th}$. Reducing the c2v magnitude based on the syndrome weight may improve decoding by helping the decoder to "jump" out of trapping sets. Trapping sets may be the main cause of an error-floor characteristic of a decoder.

Use of the 2-bit messages as presented in Table 1 enables a low-complexity architecture to implement the check and variable node processing, such as depicted in the examples of FIGS. 2-4. The CNU for a conventional Min-sum decoder involves multi-bit comparators and multiplexors. Since the check node processing of a 2-bit message passing decoder has limited number of input bits, CNU computations can be combined and described by a table, from which a Boolean equation can be further simplified using Karnaugh map or through a synthesis tool. For example, logic for the $R_c^{cnt}$ updating and saturation in Table 1 may be described by Table 2. In Table 2, '1' and '0' represent magnitudes S and W, respectively. Implementation of the combinational logic according to Table 2 uses less area than the multi-bit comparators and multiplexors of a conventional column-layered Min-sum CNU.

TABLE 2

| | $|Q_{vc}^{(i+1)}||Q_{vc}^{(i)}|$ | | | |
|---|---|---|---|---|
| Current $R_c^{cnt}$ | 00 | 01 | 10 | 11 |
| 000 | 001 | 001 | 000 | 000 |
| 001 | 001 | 010 | 000 | 001 |
| 010 | 010 | 011 | 001 | 010 |
| 011 | 011 | 100 | 010 | 011 |
| 100 | 100 | 101 | 011 | 100 |
| 101 | 101 | 110 | 100 | 101 |
| 110 | 110 | 111 | 101 | 110 |
| 111 | 111 | 111 | 110 | 111 |
| | | Next $R_c^{cnt}$ | | |

FIG. 2 shows an example implementation of a column-layered 2-bit MP LDPC decoder architecture 200 that may correspond to the decoder 136 of FIG. 1. The decoder architecture 200 includes a first CNU stage 210 including first check node units (CNUBs) 211-214, a shifting stage 220 including reverse shifters 221-224, a VNU stage 230 including VNUs 231-233, a shifting stage 240 including shifters 241-244, and a second CNU stage 250 including second CNUs (CNUAs) 251-254. An input buffer 202 and an output buffer 204 are coupled to the VNUs 231-233. A $Q_{vc}$ memory 206 is coupled to the CNUBs 211-214, to the CNUAs 241-244, and to the barrel shifters 241-244. An $R_c$ RAM (RRAM) 260 is coupled to the CNUAs 251-254 and to the CNUBs 211-214. The RRAM 260 may include registers for recording $R_c^{cnt}$ and sign products and may also include multiplexors and switching circuitry for routing outputs of the CNUAs 251-254 to the registers and connecting the outputs of the registers to the inputs of the CNUBs 211-214 according to the locations of the nonzero submatrices in H. The VNU stage 230 may correspond to the VNU stage 150 of FIG. 1, the CNU stage 250 may correspond to the CNU stage 156 of FIG. 1, the $Q_{vc}$ memory 206 may correspond to the variable-to-check message storage 148 of FIG. 1, and the RRAM 260 may correspond to the count storage 146 of FIG. 1.

The CNUBs 211-214 are configured to reconstruct c2v messages, such as explained with reference to Table 1. For example, each of the CNUBs 211-214 may include Z CNUs that correspond to a group of Z check nodes of a submatrix of the parity check matrix 142 of FIG. 1. Four CNUBs 211-214 are illustrated for an example implementation where the column weight $d_v$ is four, and the number of CNUBs may be increased or decreased in other implementations having different column weights. The first CNU stage 210 is coupled to receive counts $R_c^{cnt}$ 290 from the RRAM 260 and to receive $Q_{vc}$ messages from the $Q_{vc}$ memory 206. Each of the Z CNUs in each of the CNUBs 211-214 may reconstruct c2v messages 216 for the variable nodes that are connected to the CNU's check node, as described in the check node processing (c2v message reconstruction portion) of Table 1.

The reverse shifters 221-224 cyclically shift the Z messages associated with a Z×Z submatrix of the quasi-cyclic H matrix. For example, the reverse shifters 221-224 may shift the c2v messages 216 from each CNUBs 211-214 based on a shift amount of the parity check submatrix that corresponds to the check nodes of the respective CNUBs 211-214. The shifting stage 220 may output c2v messages 226 that are aligned to inputs of the destination VNUs 231-233. The aligned c2v messages 226 are routed to the respective VNUs 231-233.

The VNUs 231-233 are configured to receive channel information from the input buffer 202 and the aligned c2v messages 226 from the shifting stage 220. The VNU stage 230 may include a separate VNU for each variable node in a column layer (e.g., Z VNUs). Each VNU 231-233 may generate a hard decision estimate (e.g., the hard bit 166 of FIG. 1) and v2c messages (e.g., the v2c message 168 of FIG. 1), such as described in the hard decision computation and the variable node processing portions, respectively, of Table 1. For example, each VNU block 231-233 may use $d_v$ c2v messages and the channel information from the input buffer 202 to generate $d_v$ v2c messages and a hard decision bit. The hard decision bits may be stored at the output buffer 204, and the v2c messages are routed to the barrel shifters 241-244. Example VNU architectures are described with reference to FIG. 3 and FIG. 4.

Each of the barrel shifters 241-244 cyclically shifts the Z messages associated with a Z×Z submatrix of the quasi-cyclic H matrix. The CNUAs 251-254 are configured to receive the shifted v2c messages from the shifting stage 240, the magnitudes of the $Q_{vc}$ messages from the $Q_{vc}$ memory 206, sign information of the c2v messages 216 (e.g., sign $(R_{cv}^{(i+1)})$), and the counts $R_c^{cnt}$ 290. The CNUAs 251-254 are configured to update each count to generate updated counts $R_c^{cnt}$ 256, such as according to the examples of Table 1 and Table 2. The updated counts $R_c^{cnt}$ 256 are stored in the RRAM 260 and may be later retrieved for another column as counts $R_c^{cnt}$ 292. The counts $R_c^{cnt}$ 292 are provided to CNUBs as the counts $R_c^{cnt}$ 290.

The CNUBs 211-214 may be configured to receive an input signal indicating whether a syndrome weight is less than a syndrome weight threshold (SW<$SW_{th}$) and may reduce a c2v message magnitude as described in Table 1. In other implementations, such as depicted in FIG. 2, the VNUs may instead receive the input signal indicating whether a syndrome weight is less than a syndrome weight threshold (SW<$SW_{th}$) and may selectively reduce the magnitude of received c2v messages having magnitude S.

Since each of the c2v messages 216 has only two bits in the 2-bit MP algorithm, the generation of each v2c message is dependent on a relatively small number of input bits. Hence, the variable node units (VNUs) in a 2-bit MP decoder can be more efficiently implemented by look-up table (LUT) based approaches. Two examples of LUT-based VNU architectures are shown in FIGS. 3-4. Content of the LUTs may be pre-computed based on the values of C, S, W, a weight $d_v$ of the block columns of the LDPC code (e.g., whether $d_v$ is 4 or 3), and whether the syndrome weight (SW) is less than a pre-determined threshold $SW_{th}$. In implementations where the code has constant column weight, the VNU architecture of FIG. 3 may have lower complexity than the VNU architecture of FIG. 4. As compared to conventional VNU architectures that include 5 sign magnitude-to-2's complement converters, 8 integer adders, and 4 saturation blocks, the VNU architectures of FIGS. 3-4 use less area.

FIG. 3 depicts a VNU architecture 300 that includes four v2c message LUTs 301-304 and a hard decision LUT 310. Each v2c message LUT 301-304 may be a variable-to-check lookup table circuit configured to output a variable-to-check message corresponding to a check node. The hard decision LUT 310 may be a hard-decision lookup table circuit configured to output a hard decision value corresponding to a variable node. Inputs 321-324 are configured to receive c2v messages corresponding to the variable node, and an input 325 is configured to receive a channel input value.

Each v2c message LUT 301-304 may be configured to receive three of the four received c2v messages $R_{1v}^{(i+1)}$ (a c2v message from check node "1" to variable node "v"), $R_{2v}^{(i+1)}$ (a c2v message from check node "2" to variable node v), $R_{3v}^{(i+1)}$ (a c2v message from check node "3" to variable node v), and $R_{4v}^{(i+1)}$ (a c2v message from check node "4" to variable node v) from the inputs 321-324. For example, the v2c message LUT 301 receives c2v messages from check nodes 2, 3, and 4 and generates a v2c message $Q_{v1}^{(i+1)}$ for check node 1. The v2c message LUT 302 receives c2v messages from check nodes 1, 3, and 4 and generates a v2c message $Q_{v2}^{(i+1)}$ for check node 2. The v2c message LUT 303 receives c2v messages from check nodes 1, 2, and 4 and generates a v2c message $Q_{v3}^{(i+1)}$ for check node 3. The v2c message LUT 304 receives c2v messages from check nodes 1, 2, and 3 and generates a v2c message $Q_{v4}^{(i+1)}$ for check node 4. Each v2c message LUT also receives the channel input $r_v^{(0)}$ for the variable node v.

Each of the v2c message LUTs 301-304 may generate a v2c message having a value as indicated in Table 1. However, instead of performing the additions and comparisons indicated in Table 1, each v2c message LUT may include combinatorial logic circuitry to generate or select the output v2c messages based on the received inputs. Combinatorial logic circuitry to implement the LUTs is simplified by the 2-bit c2v messages, which may be restricted to have one of only four values: +S, −S, +W, −W. and the 1-bit channel input $r_v^{(0)}$.

The v2c message LUTs 301-304 may also receive an input signal indicating whether a syndrome weight is less than a syndrome weight threshold (SW<$SW_{th}$) and to reduce the magnitude of received c2v messages, such as described with reference to FIG. 2. The v2c message LUTs 301-304 may also be configured for decoding using H matrices with one or more column layers having column weight $d_v$ of 3 and with one or more column layers having column weight $d_v$ of 4. The v2c message LUTs 301-304 may receive an input that includes an indication of a whether the column weight is 3 or 4 (or equivalently, whether or not the column weight is 4, as depicted in FIG. 3). The v2c message LUTs 301-304 may receive v2c messages from at least two of the inputs 321-324. For example, if $d_v$ is 3, the fourth input 324 may not receive a valid c2v message. The v2c message LUT 301 may therefore receive valid c2v messages from inputs 322 and 323, but not from inputs 321 and 324. If instead $d_v$ is 4, the v2c message LUT 301 may receive valid c2v messages from inputs 322, 323, and 324, but not from input 321.

The hard decision LUT 310 receives each of the four c2v messages and the channel input $r_v^{(0)}$ for the variable node v and generates a hard decision $r_v^{(i+1)}$ as indicated in Table 1. Combinatorial logic circuitry to implement the hard decision LUT 310 is also simplified by the 2-bit c2v messages and the 1-bit channel input. The hard decision LUT 310 may also receive an input signal indicating whether a syndrome weight is less than a syndrome weight threshold ($SW<SW_{th}$) and an indication of whether the column weight is 3 or 4 (or equivalently, whether or not the column weight is 4, as depicted in FIG. 3).

FIG. 4 depicts a VNU architecture 400 that includes four decoders 411-414, a summer 430, four v2c message LUTs 441-444, and a hard decision LUT 450.

Each decoder 411-414 may be a one-hot decoder circuit configured to generate one-hot outputs corresponding to the check-to-variable messages. For example the first decoder 411 may be a 2-to-4 decoder that receives the 2-bit c2v message $R_{1v}^{(i+1)}$ it and outputs a one-hot signal, such as by asserting one of four outputs of the decoder 411. To illustrate, the decoder 411 may assert a first output when $R_{1v}^{(i+1)}$ has the value +S, a second output when $R_{1v}^{(i+1)}$ has the value −S, a third output when $R_{1v}^{(i+1)}$ has the value +W, or a fourth output when $R_{1v}^{(i+1)}$ has the value −W.

The summer 430 is configured to output counts of the one-hot outputs. For example, the summer 430 may be configured to output to the first v2c message LUT 441 counts from the decoders 412, 413, and 414 including a first count of one-hot outputs corresponding to +S, a second count of one-hot outputs corresponding to −S, a third count of one-hot outputs corresponding to +W, and a fourth count of one-hot outputs corresponding to −W. The summer 430 may be configured to output to the second v2c message LUT 442 counts of one-hot outputs corresponding to +S, −S, +W, and −W, respectively, from the decoders 411, 413, and 414. The summer 430 may be configured to output to the third v2c message LUT 443 counts of one-hot outputs corresponding to +S, −S, +W, and −W, respectively, from the decoders 411, 412, and 414. The summer 430 may be configured to output to the fourth v2c message LUT 444 counts of one-hot outputs corresponding to +S, −S, +W, and −W, respectively, from the decoders 411, 412, and 413. The summer 430 may also be configured to output to the hard decision LUT 450 counts of one-hot outputs corresponding to +S, −S, +W, and −W, respectively, from the decoders 411, 412, 413, and 414.

Each v2c message LUT 441-444 may be a variable-to-check lookup table circuit configured to output a variable-to-check message corresponding to a check node. The hard decision LUT 450 may be a hard-decision lookup table circuit configured to output a hard decision value corresponding to a variable node.

Each of the v2c message LUTs 441-444 may generate a v2c message having a value as indicated in Table 1. However, instead of performing the additions and comparisons indicated in Table 1, each v2c message LUT may include combinatorial logic circuitry to generate or select the output v2c messages based on the received counts of one-hot inputs. Combinatorial logic circuitry to implement the LUTs is simplified by the 2-bit counts and the 1-bit channel input $r_v^{(0)}$.

The v2c message LUTs 441-444 may also receive an input signal indicating whether a syndrome weight is less than a syndrome weight threshold ($SW<SW_{th}$) and to selectively reduce the magnitude of received c2v messages, such as described with reference to FIG. 2. The VNU architecture 400 may also be configured for decoding using H matrices having one or more column layers with column weight $d_v$ of 3 and one or more column layers having column weight $d_v$ of 4. An indication of a whether the column weight is 3 or 4 (or equivalently, whether or not the column weight is 4, as depicted in FIG. 3) may be received as an input. A gating circuit 420 is responsive to the indication to selectively gate (e.g., de-assert or drive to "0") the one-hot outputs of the decoder 414 when the column weight is 3.

The hard decision LUT 450 receives counts of one-hot values of the four decoders 411-414 and the channel input $r_v^{(0)}$ for the variable node v and generates a hard decision $r_v^{(i+1)}$ as indicated in Table 1. Because a count of one-hot values from the four decoders 411-414 can have a value of "4", the counts from the summer 430 to the hard decision LUT 450 are 3-bit values. The hard decision LUT 450 may also receive an input signal indicating whether a syndrome weight is less than a syndrome weight threshold ($SW<SW_{th}$).

By determining v2c messages and the hard bit decision based on counts of c2v message values, the VNU architecture of FIG. 4 is configurable to handle different column weights via inclusion of the gating circuit 420 (e.g., four AND gates). In contrast to FIG. 4, configuring the VNU architecture of FIG. 3 to operate based on the column weight input signal involves adding inputs to the v2c message LUTs that indicates how many c2v messages should not be taken into account. These extra inputs may cause asymmetry to the LUTs and may result in increased area when the LUTs are implemented using combinatorial logic.

Figure 5:
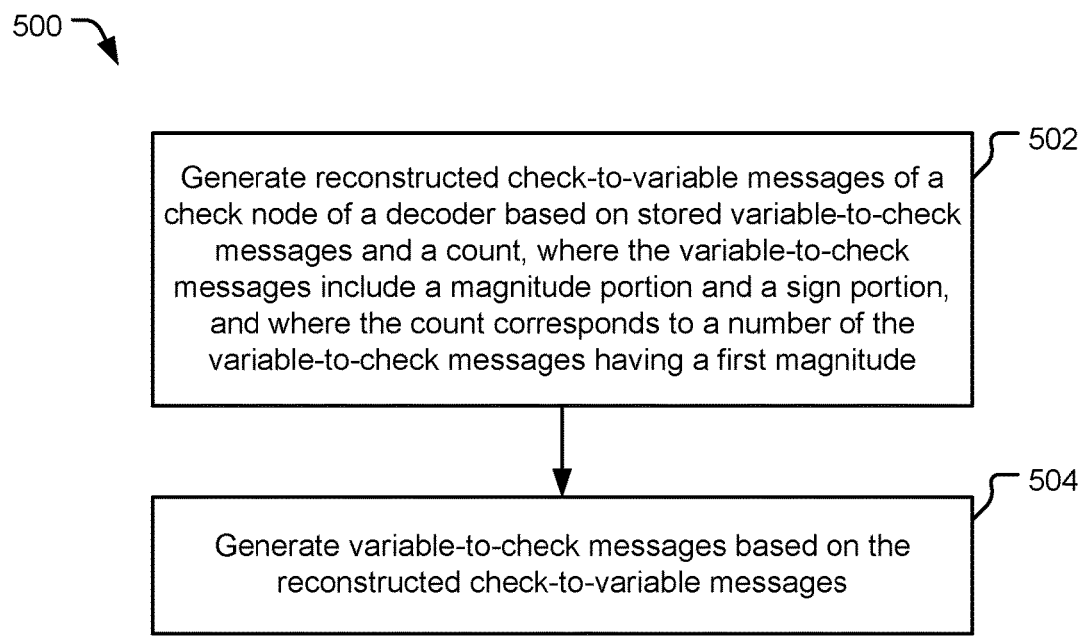
FIG. 5 is a flow chart of an illustrative example of a method of updating messages that may be performed by the decoder of FIG. 1.

Referring to FIG. 5, a particular illustrative example of a method is depicted and generally designated 500. The method 500 may be performed at a device, such as at the device 102 of FIG. 1.

Reconstructed check-to-variable messages of a check node of a decoder are generated based on stored variable-to-check messages and a count, at 502. The variable-to-check messages include a magnitude portion and a sign portion, and the count corresponds to a number of the variable-to-check messages having a first magnitude. For example, the count may be retrieved from the count storage 146 and used to generate the reconstructed c2v message 160. The c2v message 160 may be reconstructed based on the count (e.g., $R_c$ 172) of variable-to-check messages having the first magnitude W (e.g., 0) instead of having the second magnitude S (e.g., 1).

Variable-to-check messages are generated based on the reconstructed check-to-variable messages, at 504. For example, the v2c message 168 may be generated by the LUT-based VNU 152 of FIG. 1. Each of the variable-to-check messages may be generated as an output of a variable-to-check table lookup operation. For example, each variable-to-check message may correspond to a message Q output by one of the v2c message LUTs 301-304 of FIG. 3 or by one of the v2c message LUTs 441-444 of FIG. 4. In a particular implementation, each variable-to-check message is a two-bit value and the count is a three-bit value. A hard decision value corresponding to a variable node may also be generated by performing a hard decision table lookup operation, such as at the hard decision LUT 310 of FIG. 3 or the hard decision LUT 450 of FIG. 4.

The check-to-variable messages and the variable-to-check messages may be generated according to a column-layered low density parity check (LDPC) decoding schedule, such as the column-layered decoding schedule 144 of FIG. 1.

In some implementations, the count may correspond to a saturating counter of the number of the variable-to-check messages having the first magnitude, such as illustrated in the example of Table 2. In some implementations, generating the reconstructed check-to-variable messages may include using a reduced message magnitude in response to a syndrome weight threshold exceeding a syndrome weight. To illustrate, in the check node processing example in Table 1, $R_{cv}^{(i+1)}$ may be set to S−1 (rather than S) when the syndrome weight (SW) is greater than or equal to the syndrome weight threshold $SW_{th}$.

By generating reconstructed check-to-variable messages based on stored variable-to-check messages and the count, decoding may be performed using a reduced amount of memory as compared to conventional Min-sum decoding. Relatively small message sizes (e.g., 2-bit messages) enables complexity reduction via use of lookup tables in VNUs and CNUs. As a result, decoder cost and size may be reduced as compared to conventional Min-sum LDPC decoders.

Although various components depicted herein are illustrated as block components and described in general terms, such components may include one or more microprocessors, state machines, or other circuits configured to enable such components to perform one or more operations described herein. For example, decoder 136 of FIG. 1 may represent physical components, such as hardware controllers, state machines, logic circuits, or other structures, to enable the controller 130 to decode representations of codewords received from the memory 104.

Alternatively or in addition, at least a portion of the decoder 136 may be implemented using a microprocessor or microcontroller. For example, the decoder 136 may include a processor executing instructions (e.g., firmware) that are stored at the memory 104. Alternatively, or in addition, executable instructions that are executed by the processor may be stored at a separate memory location that is not part of the memory 104, such as at a read-only memory (ROM) of the controller 130.

It should be appreciated that one or more operations described herein as being performed by the controller 130 may be performed at the memory device 103. As an illustrative example, in-memory ECC operations (e.g., encoding operations and/or decoding operations) may be performed at the memory device 103 alternatively or in addition to performing such operations at the controller 130.

The device 102 may be coupled to, attached to, or embedded within one or more accessing devices, such as within a housing of the device 180. For example, the device 102 may be embedded within the device 180 in accordance with a Joint Electron Devices Engineering Council (JEDEC) Solid State Technology Association Universal Flash Storage (UFS) configuration. To further illustrate, the device 102 may be integrated within an electronic device (e.g., the device 180), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the device 102 may be implemented in a portable device configured to be selectively coupled to one or more external devices, such as a host device. For example, the device 102 may be removable from the device 180 (i.e., "removably" coupled to the device 180). As an example, the device 102 may be removably coupled to the device 180 in accordance with a removable universal serial bus (USB) configuration.

The device 180 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The device 180 may communicate via a controller, which may enable the device 180 to communicate with the device 102. The device 180 may operate in compliance with a JEDEC Solid State Technology Association industry specification, such as an embedded MultiMedia Card (eMMC) specification or a Universal Flash Storage (UFS) Host Controller Interface specification. The device 180 may operate in compliance with one or more other specifications, such as a Secure Digital (SD) Host Controller specification as an illustrative example. Alternatively, the device 180 may communicate with the device 102 in accordance with another communication protocol. In some implementations, the device 102 may be integrated within a network-accessible data storage system, such as an enterprise data system, an NAS system, or a cloud data storage system, as illustrative examples.

In some implementations, the device 102 may include a solid state drive (SSD). The device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the device 102 may be coupled to the device 180 via a network. For example, the network may include a data center storage system network, an enterprise storage system network, a storage area network, a cloud storage network, a local area network (LAN), a wide area network (WAN), the Internet, and/or another network.

To further illustrate, the device 102 may be configured to be coupled to the device 180 as embedded memory, such as in connection with an embedded MultiMedia Card (eMMC®) (trademark of JEDEC Solid State Technology Association, Arlington. Va.) configuration, as an illustrative example. The device 102 may correspond to an eMMC device. As another example, the device 102 may correspond to a memory card, such as a Secure Digital (SD®) card, a microSD® card, a miniSD™ card (trademarks of SD-3C LLC, Wilmington. Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The device 102 may operate in compliance with a JEDEC industry specification. For example, the device 102 may operate in compliance with a JEDEC eMMC specification, a JEDEC Universal Flash Storage (UFS) specification, one or more other specifications, or a combination thereof.

A memory (e.g., a drive of the memory device 103) may include a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), another type of memory, or a combination thereof. In a particular embodiment, the device 102 is indirectly coupled to an accessing device (e.g., the device 180) via a network. For example, the device 102 may be a network-attached storage (NAS) device or a component (e.g., a solid-state drive (SSD) component) of a data center storage system, an enterprise storage system, or a storage area network.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A decoder comprising:
a variable node unit (VNU) comprising:
a variable-to-check lookup table circuit configured to output a variable-to-check message corresponding to a check node based on message value counts,
a hard-decision lookup table circuit configured to output a hard-decision value corresponding to a variable node,
inputs configured to receive check-to-variable messages corresponding to the variable node, and
a plurality of variable-to-check lookup table circuits that includes the variable-to-check lookup table circuit; and
a check node unit (CNU) responsive to the variable-to-check message and configured to generate an updated check-to-variable message.

2. The decoder of claim 1, wherein:
the VNU is included in a VNU stage that comprises a first number of VNUs corresponding to a column layer of a parity check matrix,
the CNU is included in a CNU stage that comprises a second number of CNUs corresponding to a multiple of a column weight of the parity check matrix, and
the VNU stage and the CNU stage are configured to operate according to a column-layered decoding schedule.

3. The decoder of claim 1, wherein the variable-to-check lookup table circuit is configured to receive the check-to-variable messages from at least two of the inputs.

4. The decoder of claim 3, wherein each of the check-to-variable messages includes a two-bit message.

5. The decoder of claim 1, wherein the VNU comprises a one-hot decoder circuit configured to generate one-hot outputs corresponding to the check-to-variable messages.

6. The decoder of claim 5, further comprising a summer coupled to the variable-to-check lookup table circuit and configured to output counts of the one-hot outputs.

7. The decoder of claim 1, wherein the variable-to-check message includes a two-bit message.

8. The decoder of claim 1, wherein the VNU is configured to receive multiple messages and to generate a count of the multiple messages that have a particular message value.

9. The decoder of claim 1, wherein the VNU is configured to receive a plurality of distinct message values and to generate a count corresponding to each of the plurality of distinct message values.

10. The decoder of claim 1, wherein the CNU is configured to generate the updated check-to-variable message based at least in part on the message value counts.

11. The decoder of claim 1, wherein the CNU is configured to generate a count of variable-to-check messages output from the VNU that indicate a particular magnitude.

12. The decoder of claim 1, wherein the CNU is configured to generate the updated check-to-variable message based on a determination of whether a syndrome weight associated with the updated check-to-variable message is less than a syndrome weight threshold.

13. The decoder of claim 1, wherein the CNU is configured to reconstruct the check-to-variable messages based on a count corresponding to variable-to-check messages having a particular magnitude value and based on stored variable-to-check messages.

14. An apparatus comprising:
means for producing a variable-to-check message corresponding to a check node, the means for producing configured to
output the variable-to-check message based on a variable-to-check lookup operation;
means for outputting a hard-decision value corresponding to a variable node, the means for outputting configured to output the hard-decision value based on a hard-decision lookup operation;
means for receiving check-to-variable messages corresponding to the variable node;
means for generating an updated check-to-variable message, the means for generating configured to generate the updated check-to-variable message responsive to the variable-to-check message; and
a one-hot decoder circuit configured to generate one-hot outputs corresponding to the check-to-variable messages.

15. The apparatus of claim 14, wherein:
the means for producing and the means for outputting are included in a variable node unit (VNU) stage that comprises a first number of VNUs corresponding to a column layer of a parity check matrix,
the means for generating is included in a check node unit (CNU) stage that comprises a second number of CNUs corresponding to a multiple of a column weight of the parity check matrix, and
the VNU stage and the CNU stage are configured to operate according to a column-layered decoding schedule.

16. A method comprising:
outputting a variable-to-check message at a variable-to-check lookup table circuit of a variable node unit (VNU), the variable-to-check message corresponding to a check node of a decoder and generated based on message value counts;
outputting a hard-decision value at a hard-decision lookup table circuit, the hard-decision value corresponding to a variable node of the decoder;
receiving check-to-variable messages corresponding to the variable node;
generating one-hot outputs corresponding to the check-to-variable messages;
outputting counts of the one-hot outputs; and
generating an updated check-to-variable message, the updated check-to-variable message generated at a check node unit (CNU) responsive to the variable-to-check message.

17. The method of claim 16, wherein:
the VNU is included in a VNU stage that comprises a first number of VNUs corresponding to a column layer of a parity check matrix, the CNU is included in a CNU stage that comprises a second number of CNUs corresponding to a multiple of a column weight of the parity check matrix, and the VNU stage and the CNU stage operate according to a column-layered decoding schedule.

18. The method of claim 16, wherein the VNU receives two-bit check-to-variable messages from the CNU, and wherein the CNU receives two-bit variable-to-check messages from the VNU.

19. The method of claim 16, further comprising outputting, at the variable-to-check lookup table circuit, a count of check-to-variable messages that are indicative of a particular message value.

* * * * *